United States Patent [19]
Yamamoto

[11] Patent Number: 5,229,731
[45] Date of Patent: Jul. 20, 1993

[54] POWER AMPLIFYING CIRCUIT CAPABLE OF SWITCHING AMPLIFICATION MODE

[75] Inventor: Tomohiko Yamamoto, Yokohama, Japan

[73] Assignee: Kabushiki Kaisha Toshiba, Kawasaki, Japan

[21] Appl. No.: 744,716

[22] Filed: Aug. 14, 1991

[30] Foreign Application Priority Data

Aug. 15, 1990 [JP] Japan .................................. 2-215492
Jul. 24, 1991 [JP] Japan .................................. 3-184760

[51] Int. Cl.$^5$ .............................................. H03F 3/19
[52] U.S. Cl. ...................................... 330/296; 330/130; 330/286
[58] Field of Search ............... 330/127, 130, 138, 296, 330/286; 455/127

[56] References Cited

U.S. PATENT DOCUMENTS 5,060,294 10/1991 Schwent et al. ................ 330/296 X Primary Examiner—James B. Mullins
Attorney, Agent, or Firm—Oblon, Spivak, McClelland, Maier & Neustadt

[57] ABSTRACT

The power amplifying circuit embodied by the invention is composed of a single-unit circuit capable of varying own bias condition, and yet, more than two kinds of amplifying modes can selectively be activated merely by applying a single-unit power amplifying circuit. Concretely, the power amplifying circuit embodied by the invention comprises the following, a power amplifying transistor, a base-side transmission line, a resistance element connected to the base-side transmission line, the first switching element accommodating current path formed in series against the resistance element so that the first potential can be delivered to the resistance element, the second switching element which is inserted between the base-side transmission line and the second potential, and a circuit means for varying the value of a base potential of the power amplifying transistor by means of opposite switching operations performed by the first and second switching elements.

13 Claims, 8 Drawing Sheets

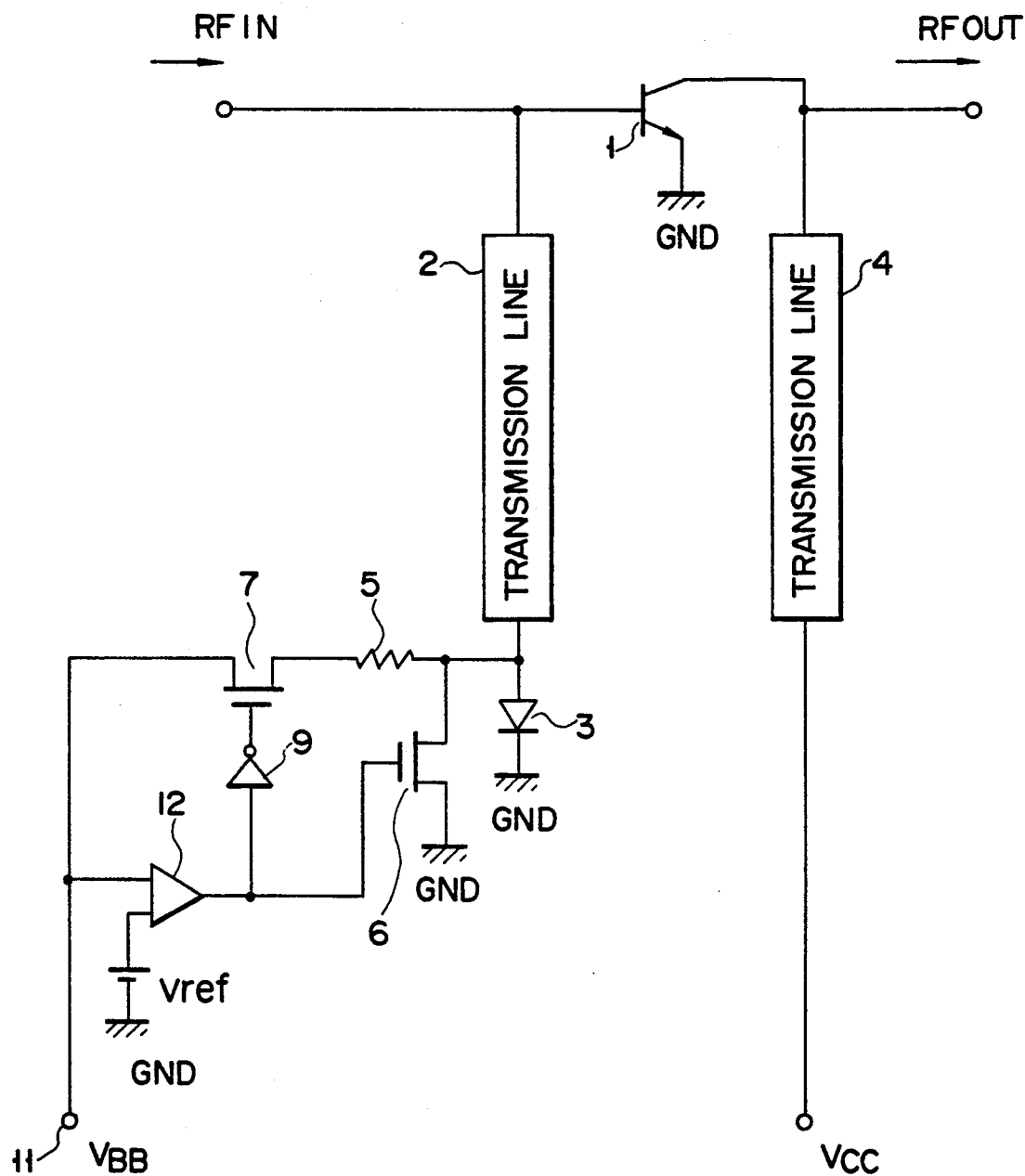
F I G. 5

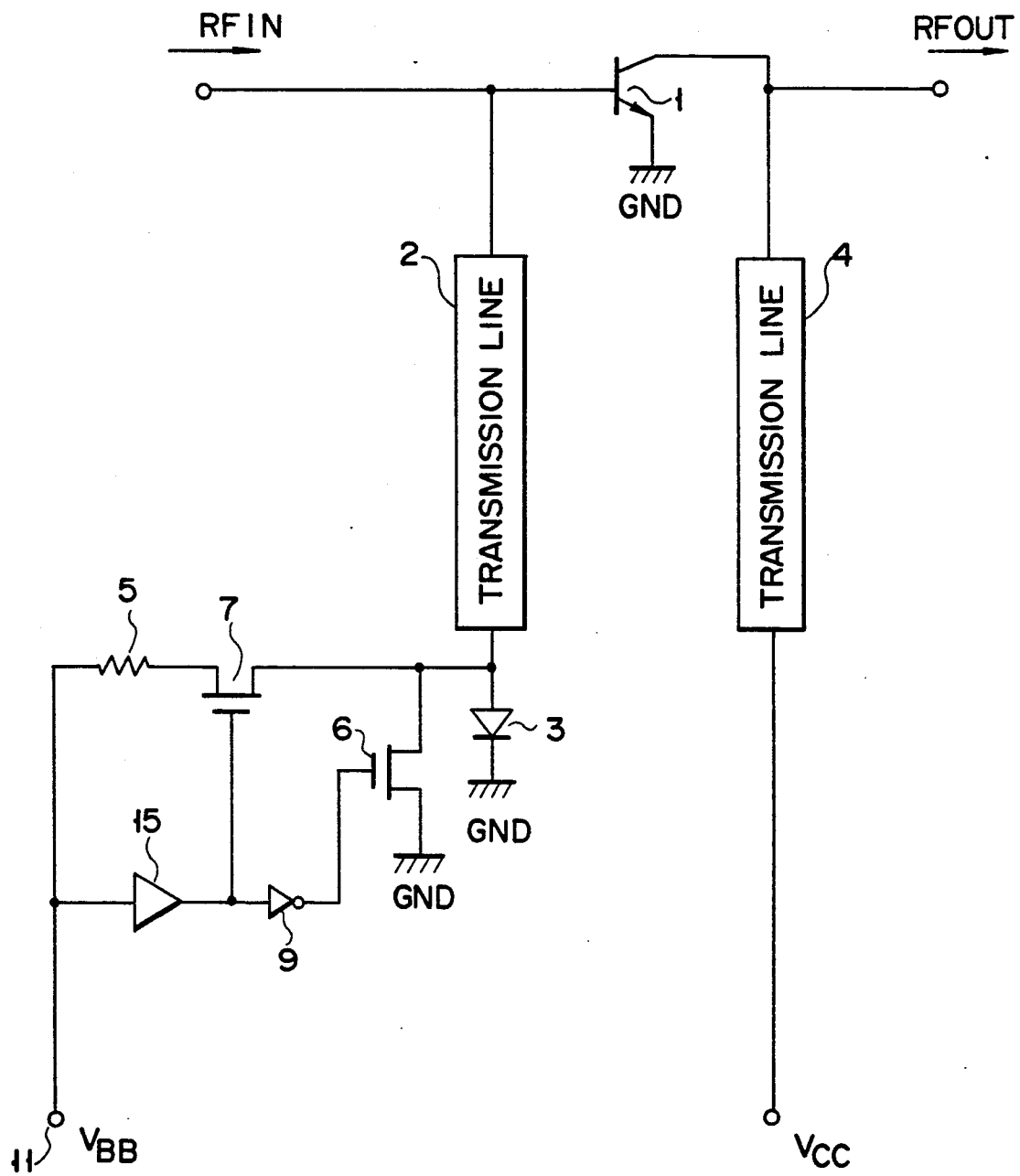
F I G. 6

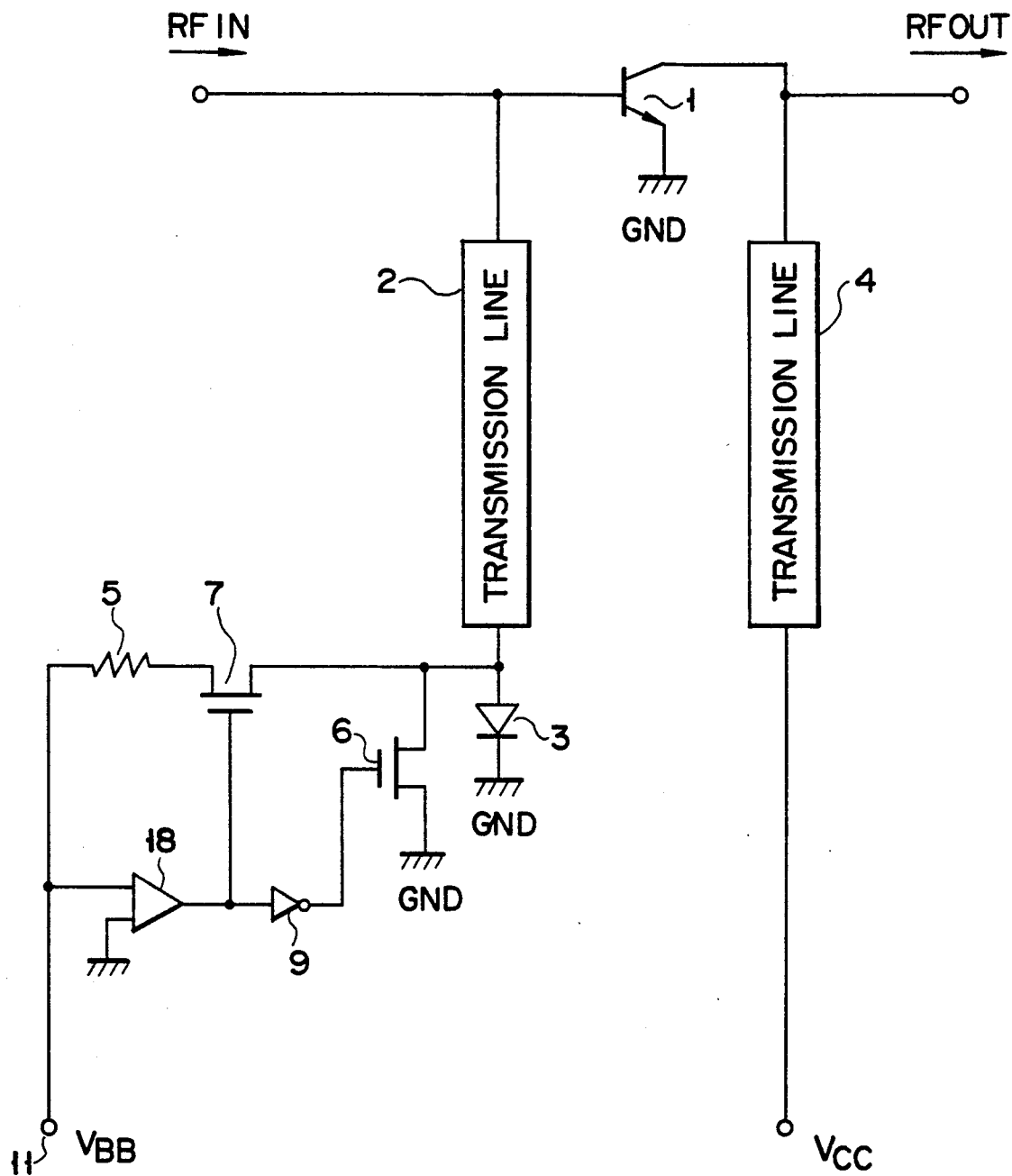
F I G. 7

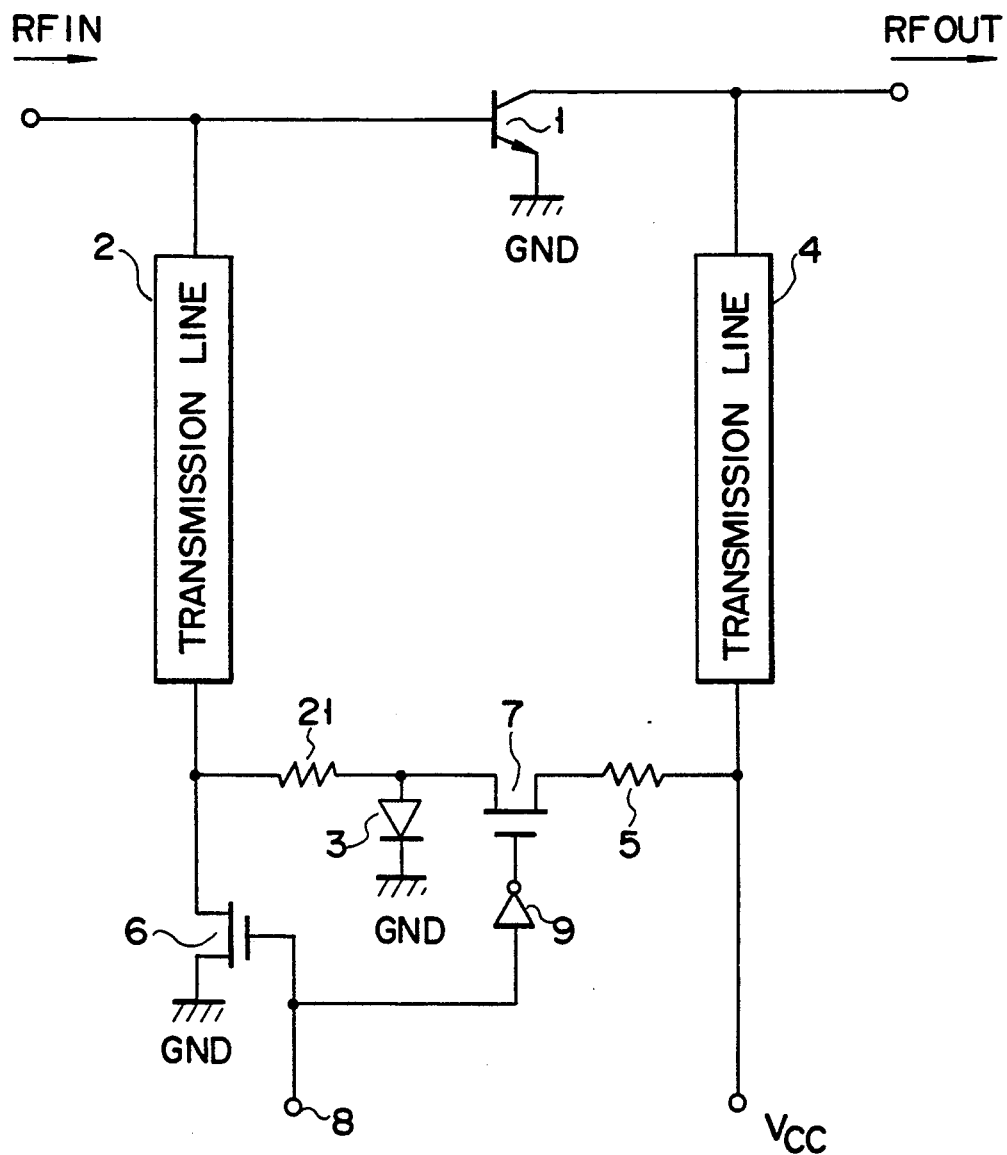
F I G. 8

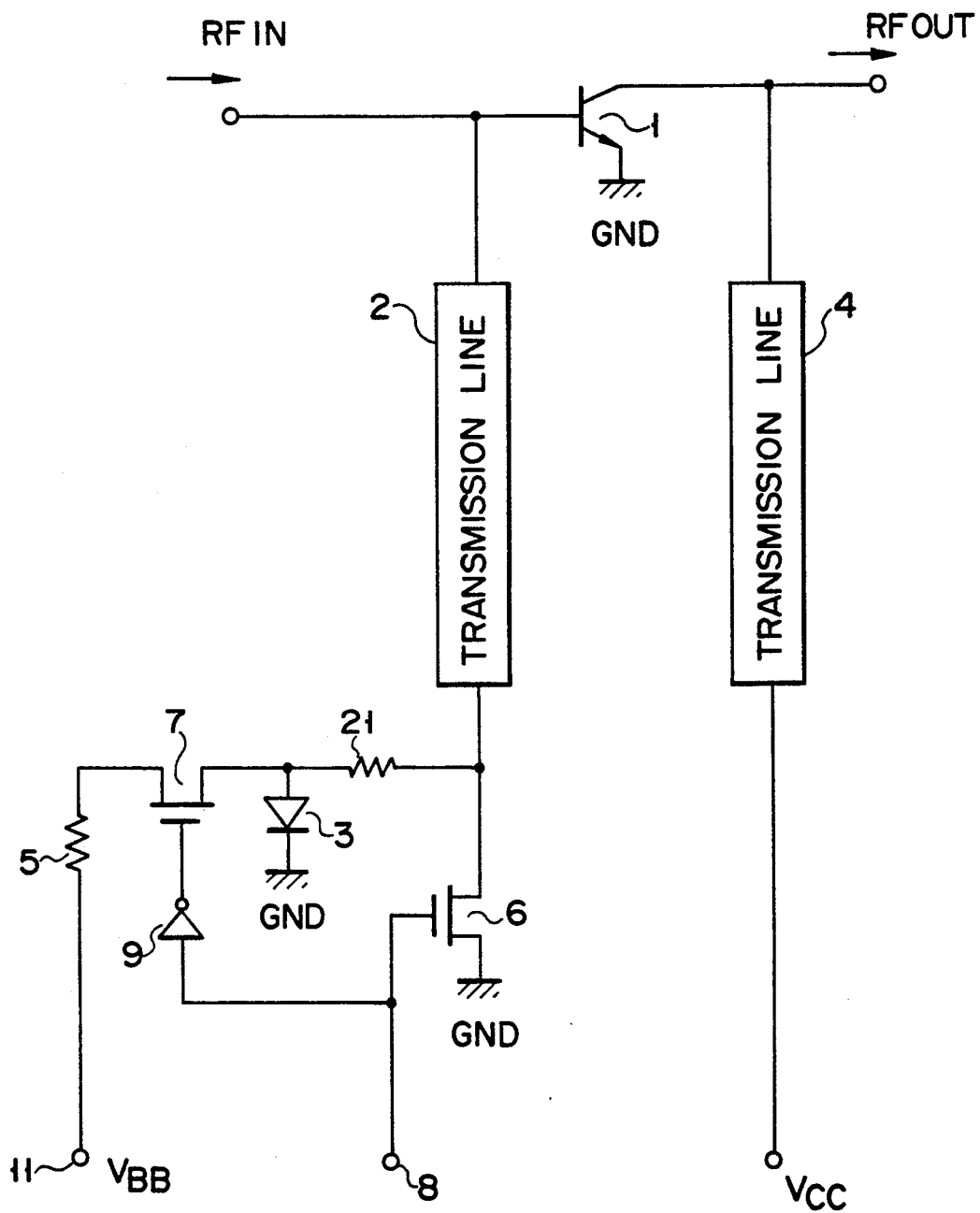
F I G. 9

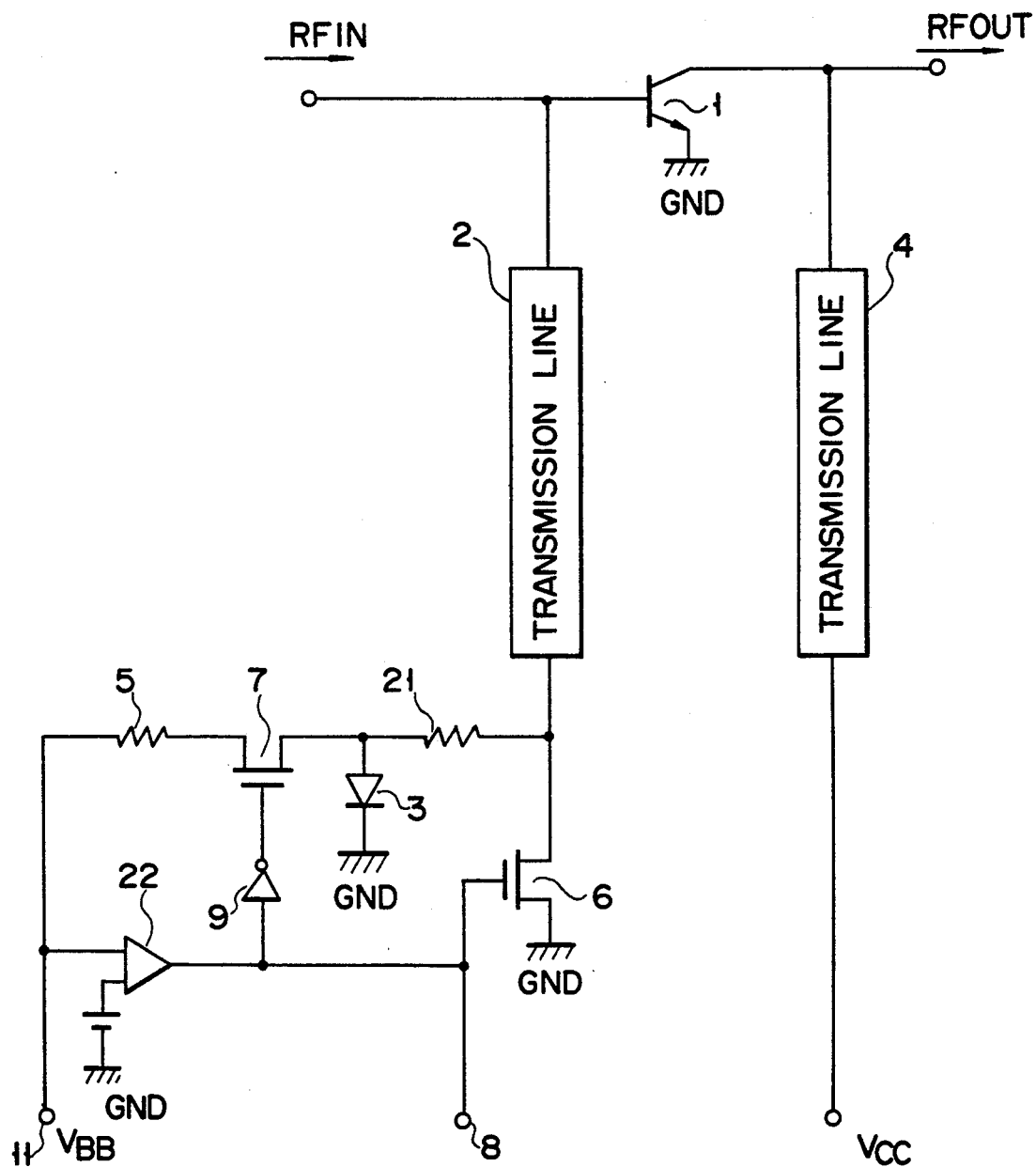
F I G. 10

POWER AMPLIFYING CIRCUIT CAPABLE OF SWITCHING AMPLIFICATION MODE

BACKGROUND OF THE INVENTION

1. Field of the Invention

The present invention relates to a high-frequency power amplifying circuit which is capable of optionally varying the power supplying mode.

2. Description of the Related Art

Either the "class A" amplification mode or the "class AB" amplification mode composing the intermediate amplification mode between the "class A" amplification and the "class B" amplification is made available for the output stage of the power amplifying circuit of any conventional transmission apparatus using either the digital transmission system or the amplitude modulation system. This is because, when operating either the digital transmission system or the amplitude modulation system, an extremely high linearity is demanded for amplifiers in order to minimize distorted modulation.

FIGS. 1 and 2 respectively designate schematic block diagram of power amplifying circuits executing the conventional "class AB" amplification. Referring now to FIG. 1, base of an NPN transistor 31 is connected to anode of a diode 33 via a base-side transmission line 32 containing inductance component. On the other hand, cathode of the diode 33 is connected to ground voltage GND. Emitter of the NPN transistor 31 is also connected to the ground voltage GND, whereas collector of the NPN transistor 31 is connected to power voltage $V_{CC}$ via a collector-side transmission line 34 containing inductance component. The power voltage $V_{CC}$ is delivered to the anode of the diode 33 via a resistor 15.

The power amplifying circuit shown in FIG. 1 is of such a structure which leads the power voltage delivered to the base of the NPN transistor 31 to the threshold value of the diode 33. The NPN transistor 31 activates the "class AB" amplifying operation in response to a bias voltage generated by the delivery of the power voltage to the diode 33. In order to conveniently feed the power voltage $V_{CC}$ to a variety of component elements, FIG. 2 designates a pair of points available for supplying the power voltage $V_{CC}$, where the circuit shown in FIG. 2 has the construction identical to that is shown in FIG. 1.

On the other hand, conventionally, frequency modulation (FM) system is introduced to the analogue transmission system which is typically represented by the automobile telephone system, where the "class C" amplification mode is mainly made available.

Referring now to FIG. 3, base terminal of an NPN transistor 51 is connected to ground voltage GND via a base-side transmission line 52 containing inductance component. On the other hand, collector terminal of the NPN transistor 51 is connected to the power voltage $V_{CC}$ via a collector-side transmission line 53 containing inductance component.

Since the FM system is introduced to the circuit shown in FIG. 3, unlike the case of applying either the "class A" or the "class AB" amplification, there is no need of precisely executing amplification with high fidelity. Preferably, power efficiency is more important. Due to the presence of the inductance component in the base-side transmission line 52, the base terminal of the NPN transistor 51 is biased by applying a voltage below 0V. In this way, conventionally, such an amplifying circuit is made available today, which is capable of varying the biasing mode according to the introduced transmission system.

Recently, in order to deal with the increased subscribers and promote security in the execution of radio communication, mobile radio communication system including the automobile telephone unit has begun to introduce the digitally modulated transmission and reception system. Substantially, the digital radio communication system is anticipated to share the majority of the radio communication system in the future by way of replacing the conventional analogue radio communication system. Reflecting this situation, there are a wide variety of radio communication systems in this transitional period from the analogue communication system to the digital communication system. When a novel radio communication apparatus compatible with the analogue and digital communication systems is practically available, more substantial benefit can be provided for users.

Nevertheless, as mentioned above, there are a variety features in both the digital and analogue communication systems. As a result, in order to properly manage both communication systems, conventionally, two kinds of power amplifying circuits ar independently made available for materializing the "class AB" amplification and the "class C" amplification.

A hybrid integrated circuit conventionally called "hybrid IC" is mainly made available for composing the power amplifying circuit of the automobile telephone unit. Nevertheless, if two kinds of power amplifying circuits were built in an automobile telephone unit to deal with both the digital and analogue communication systems, then the telephone unit itself will take substantial dimensions. This in turn involves expensive cost, and thus, from the standpoint of economy of cost, it can hardly be materialized.

SUMMARY OF THE INVENTION

Therefore, the object of the invention is to provide a novel single-unit power amplifying circuit which is ideally compatible with the analogue and digital communication systems, and yet, can be built with compact dimensions and at inexpensive cost.

Characteristically, the above object can be achieved by provision of the following;

a power amplifying circuit comprising;

a single unit of power amplifying transistor;

a base-side transmission line which is provided on the side of the base of this power amplifying transistor;

a resistor which is connected to the base-side transmission line of the power amplifying transistor;

a first switching element which accommodates current path formed in series against this resistor so that the first potential can be delivered to this resistor;

a second switching element which is inserted between the base-side transmission line and the second potential; and a circuit means for varying the value of base potential of said power amplifying transistor by means of opposite switching operations performed by the first and second switching element.

According to the invention, a power amplifying circuit capable of optionally varying the bias condition of the power amplifying circuit is provided, and yet, more than two kinds of amplifying modes can be materialized merely by applying a single unit power amplifying circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 schematically designates the block diagram of the power amplifying circuit according to the second embodiment of the invention;

FIG. 6 schematically designates the block diagram of the power amplifying circuit according to the third embodiment of the invention;

FIG. 7 schematically designates the block diagram of the power amplifying circuit according to the fourth embodiment of the invention;

FIG. 8 schematically designates the block diagram of the power amplifying circuit according to the fifth embodiment of the invention;

FIG. 9 schematically designates the block diagram of the power amplifying circuit according to the sixth embodiment of the invention; and FIG. 10 schematically designates the block diagram of the power amplifying circuit according to the seventh embodiment of the invention.

DETAILED DESCRIPTION OF THE PREFERRED EMBODIMENTS

Referring now to the accompanying drawings, the power amplifying circuit embodied by the invention is described below.

Figure 4:
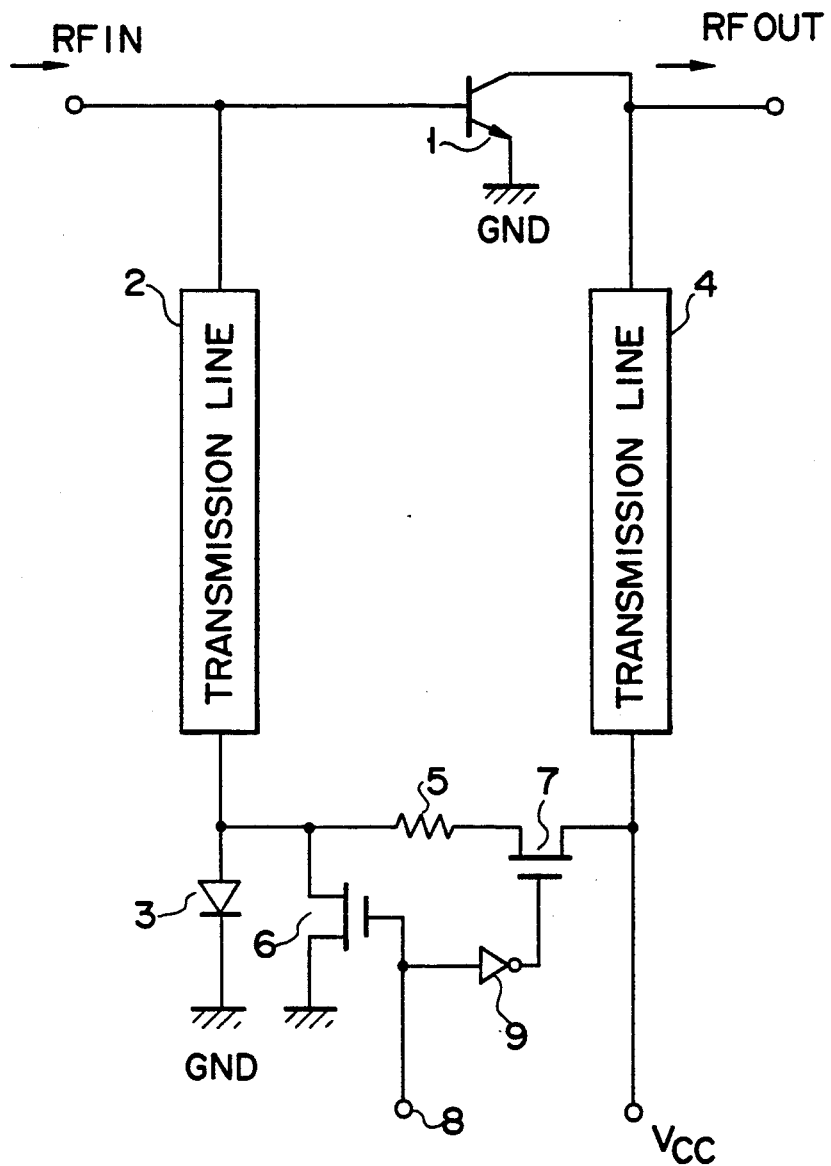
FIG. 4 schematically designates the block diagram of the power amplifying circuit according to the first embodiment of the invention.

FIG. 4 designates the block diagram of the power amplifying circuit according to the first embodiment of the invention. Initially, a high-frequency signal RFIN is delivered to the base of an NPN transistor 1 which is available for amplifying power. The base of the NPN transistor 1 is connected to anode of a diode 3 via a base-side transmission line 2 containing inductance component. Cathode of the diode 3 is connected to ground voltage GND. Substantially, the diode 3 compensates for temperature and executes a biasing function needed for performing the "class AB" amplifying operation. On the other hand, emitter of the NPN transistor 1 is connected to the ground voltage GND, whereas collector of the NPN transistor 1 is connected to power voltage $V_{CC}$ via a collector-side transmission line 4. The collector of the NPN transistor 1 outputs a highfrequency signal RFOUT. On the other hand, anode of the diode 3 is connected to drain of an N-channel MOS FET 6 and an end of a biasing resistor 5. Source of the MOS FET 6 is connected to the ground voltage GND. Drain of another MOS FET 7 is connected to the power voltage $V_{CC}$. The other end of the resistor 5 is connected to source of the N-channel MOS FET 7. Drain of the N-channel MOS FET 7 is connected to the power voltage $V_{CC}$.

A control node 8 is directly connected to the gate of the N-channel MOS FET 7 via an inverter 9. Accordingly, in response to a control signal output from the control node 8, those signal)opposite from each other are respectively delivered to those gates of the N-channel MOS FETs 6 and 7 so that ON-OFF operations of these MOS FETs 6 and 7 can properly be controlled.

Next, functional operation of the power amplifying circuit shown in FIG. 4 is described below. Simultaneous with the arrival of a HIGH control signal at the control node 8, the N-channel MOS FET 6 turns ON to cause the base-side transmission line 2 of the NPN transistor 1 to be grounded. On the other hand, since a bias voltage is delivered via the inverter 9, the N-channel MOS FET 7 turns OFF. As a result, the baseside transmission line 2 is electrically separated from the collector-side transmission line 4. This causes the NPN transistor 1 to enter into the biased condition from the "class C" amplifying mode.

On the other hand, simultaneous with the arrival of a LOW control signal at the control node 8, the N-channel MOS FET 6 turns OFF so that switch can be held open, and conversely, the N-channel MOS FET 7 turns ON. As a result, the base is slightly biased by 0.7 V of voltage set by the diode 3 so that the "class AB" amplifying mode can be entered.

According to the structure mentioned above, the "class AB" amplifying mode and the "class C" amplifying mode can optionally be activated merely by applying a single-unit power amplifying circuit embodied by the invention. This in turn offers substantial convenience to the radio communication system optionally using either the digital communication mode or the analogue communication mode. Furthermore, owing to compact dimensions, the power amplifying circuit embodied by the invention can easily be built in the hybrid IC which is widely made available for the automobile telephone unit.

FIG. 5 designates the block diagram of the power amplifying circuit according to the second embodiment of the invention. Note that those component elements executing functional operations identical to those shown in FIG. 4 are respectively designated by the identical reference numerals, and thus, description of these component elements is deleted here.

The power amplifying circuit shown in FIG. 5 is characteristically provided with a $V_{BB}$ node 11 which receives power needed for biasing base. Drain of the N-channel MOS FET 7 is connected to the $V_{BB}$ node 11. An operational amplifier (which is substantially a comparator) 12 is also provided for the power amplifying circuit shown in FIG. 5. An input terminal of the comparator 12 is connected to the $V_{BB}$ node 11, whereas the other input terminal of this comparator 12 receives the reference voltage $V_{ref}$. The output terminal of this comparator 12 is connected to those input terminals of the N-channel MOS FET 6 and the inverter 9.

Next, functional operation of the power amplifying circuit shown in FIG. 5 is described below. The $V_{BB}$ node 11 receives a $V_{BB}$ voltage like 5 V for example available for biasing the base. The comparator 12 receives about 10 V of the reference voltage $V_{ref}$ for example. Now, the comparator 12 outputs a LOW signal to the $V_{BB}$ voltage which is lower than the reference voltage $V_{ref}$. In response to this, the inverter 9 outputs a HIGH signal to turn the N-channel MOS FET 7 ON and the MOS FET 6 OFF. As a result, the base of the NPN transistor 2 is slightly biased by the bias voltage from the diode 3, thus permitting the NPN transistor 1 to enter into the "class AB" amplifying mode.

A consideration is given to such a case in which 12 V of voltage is delivered to the $V_{BB}$ node 11. In response to this, the comparator 12 outputs a HIGH signal to the $V_{BB}$ voltage which is higher than the reference voltage $V_{ref}$. In response to this, the inverter 9 outputs a LOW signal to turn the N-channel MOS FET 7 OFF and the N-channel MOS FET 6 ON. As a result, the base-side transmission line 2 of the NPN transistor is grounded. Since the N-channel MOS FET 7 remains OFF, switch is held open. In consequence, the $V_{BB}$ node 11 is electrically separated from the base side transmission line 2 of the NPN transistor 1, and thus, the NPN transistor 1 can enter into the "class C" amplifying mode. In this way, since the $V_{BB}$ node 11 is electrically separated, the $V_{BB}$ node 11 can be made available for making up a collector transmission line of another transistor.

The power amplifying circuit incorporating the comparator 12 shown in FIG. 5 can optionally vary the amplifying mode of the NPN transistor 1 merely by switching the voltage routed to the $V_{BB}$ node 11. As a result, unlike the power amplifying circuit shown in FIG. 4, the power amplifying circuit shown in FIG. 5 can dispense with provision of a specific signal for selecting the amplifying mode and also dispense with the control node 8. In consequence, the power amplifying circuit shown in FIG. 5 dispenses with the provision of a switching control circuit otherwise needed for selecting the amplifying mode.

FIG. 6 designates the block diagram of the power amplifying circuit according to the third embodiment of the invention. Note that those components elements executing functional operations identical to those shown in FIG. 4 are designated by the identical reference numerals, and thus, description of these component elements is deleted here. Like the one shown in FIG. 5, the power amplifying circuit shown in FIG. 6 is provided with the $V_{BB}$ node 11 which receives power needed for biasing the base. A biasing resistor 5 is inserted between the drain of the N-channel MOS FET 6 and the $V_{BB}$ node 11. In addition, an operational amplifier (which is substantially an integrator) 15 is also provided for the power amplifying circuit shown in FIG. 5. The input terminal of the integrator 15 is connected to the $V_{BB}$ node 11, whereas the output terminal of this integrator 15 is connected to the gate of the N-channel MOS FET 6 via the inverter 9. Furthermore, this output terminal is also directly connected to the gate of the N-channel MOS FET 7.

Next, functional operation of the power amplifying circuit shown in FIG. 6 is described below. A consideration is given to such a case in which a constant voltage like 5 V for example is delivered to the $V_{BB}$ node 11. Since a constant voltage is delivered to the input terminal of the integrator 15, only 0 V voltage is output from the integrator 15. As a result, the N-channel MOS FET 6 is turned ON by the inverted signal output from the inverter 9, whereas the N-channel MOS FET 7 turns itself OFF. This causes the base of the NPN transistor 1 to be grounded via the source and the drain of the N-channel MOS FET 6 by way of passing through the base-side transmission line 2 containing inductance component. As a result, the NPN transistor 1 can enter into the "class C" amplifying mode.

Here again, a consideration is given to such a case in which a logical signal containing duty cycle is delivered from the $V_{BB}$ node 11. In this case, the integrator 15 outputs a constant voltage like 5 V for example to turn the N-channel MOS FET 6 OFF and the N-channel MOS FET 7 ON. As a result, the base of the NPN transistor 1 receives bias voltage via the biasing resistor 5 and the source and drain of the N-channel MOS FET 7 to cause the diode 3 to enter into conductive condition. This in turn permits the NPN transistor 1 to enter into the "class AB" mode.

According to the structure of the power amplifying circuit shown in FIG. 6, a bias voltage based on the duty cycle of the logical signal is supplied in the course of executing the "class AB" amplifying mode. The system shown in FIG. 6 is effectively applicable to such a radio communication system like the digital radio communication system which merely executes transmission in the predetermined period of time based on the time division process. Furthermore, according to the structure of the power amplifying circuit shown in FIG. 6, conventionally available logical signal (5 V and 0 V) may be available for controlling operations of those N-channels MOS FETs 6 and 7. In other words, when the power amplifying circuit shown in FIG. 6 is introduced to any radio communication system available today control signal for switching the amplifying mode can easily be generated. Like the fourth embodiment shown in FIG. 7, the integrator 15 built in the power amplifying circuit shown in FIG. 6 may be replaced by the comparator 18. If the reference voltage were of the ground voltage, then, conventionally available logical signal (5 V and 0V) may also be made available for the control signal for switching the amplifying mode.

FIG. 8 designates the block diagram of the power amplifying circuit according to the fifth embodiment of the invention. Note that those component elements executing functional operations identical to those shown in FIG. 4 are respectively designated by the identical reference numerals, and thus, description of these component elements is deleted here.

Base of the NPN transistor 1 is connected to the drain of the N-channel MOS FET 6 via the base-side transmission line 2. Anode of the diode 3 compensating for temperature is connected to the source of the N-channel MOS FET 7. The drain of this MOS FET 7 is connected to the power voltage $V_{CC}$ via the biasing resistor 5. Another resistor 21 containing several through scores of ohms of resistance value is inserted between the anode of the diode 3 and the drain of the N-channel MOS FET 7. The resistor 21 stably prevents the NPN transistor 1 from recklessly operating itself otherwise to be caused by excessive thermal effect while the power amplifying circuit executes the "class AB" amplifying operation.

FIG. 9 designates the block diagram of the power amplifying circuit according to the sixth embodiment of the invention. Unlike the one shown in FIG. 8, the power amplifying circuit shown in FIG. 9 is provided with the $V_{BB}$ node 11 which receives power for biasing the base. As shown in FIG. 9, the connection terminal of the biasing resistor 5 is connected to the $V_{BB}$ node 11.

Next, based on the structure of the power amplifying circuit shown in FIG. 9, functional operation of the power amplifying circuits shown in FIGS. 8 and 9 are summarized below. In compliance with the control signal delivered from the control node 8, opposite signals are respectively delivered to the gates of the N-channel MOS FETs 6 and 7 in order to control operations of these MOS FETs 6 and 7.

A consideration is given to such a case in which the "class AB" amplifying mode is activated by switching those MOS FETs 6 and 7 from each other. In this case, the MOS FET 6 turns OFF, whereas the MOS FET turns ON. This in turn indicates that a bias voltage for executing the "class AB" amplifying operation is delivered to the base of the NPN transistor 1 via the base-side transmission line 2. At the same time, this bias voltage is also delivered to the resistor 21 to prevent the NPN transistor 1 from entering into a reckless operation. The bias signal is also delivered to the temperature-compensating diode 3.

On the other hand, another consideration is also given to such a case in which the "class C" amplifying mode is activated by switching those MOS FETs 6 and 7 from each other. In this case, the MOS FET 6 turns ON, whereas the MOS FET 7 turns OFF. As a result, the base of the NPN transistor 1 is grounded via the base-side transmission line 2 and the MOS FET 6. This in turn indicates that a bias voltage permitting the executing of the "class C" amplifying operation is delivered to the base of the NPN transistor 1.

FIG. 10 designates the block diagram of the power amplifying circuit according to the seventh embodiment of the invention. Unlike the one shown in FIG. 9, the power amplifying circuit shown in FIG. 10 is additionally provided with a comparator 22. An input terminal of the comparator 22 is connected to the $V_{BB}$ node 11, whereas the other input terminal of the comparator 22 receives the reference voltage $V_{ref}$. The output terminal of the comparator 22 is connected to the gate of the MOS FET 7 and the input terminal of the inverter 9.

Figure 1:
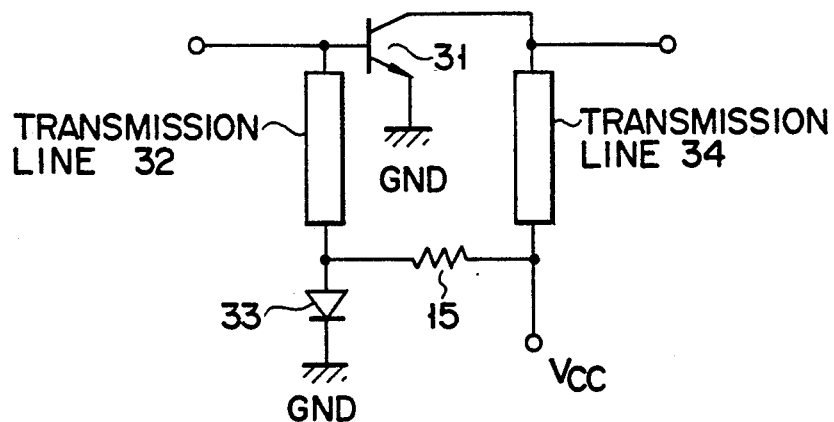
FIG. 1 schematically designates the first block diagram of a conventional power amplifying circuit solely available for the "class AB" amplification mode.
Figure 2:
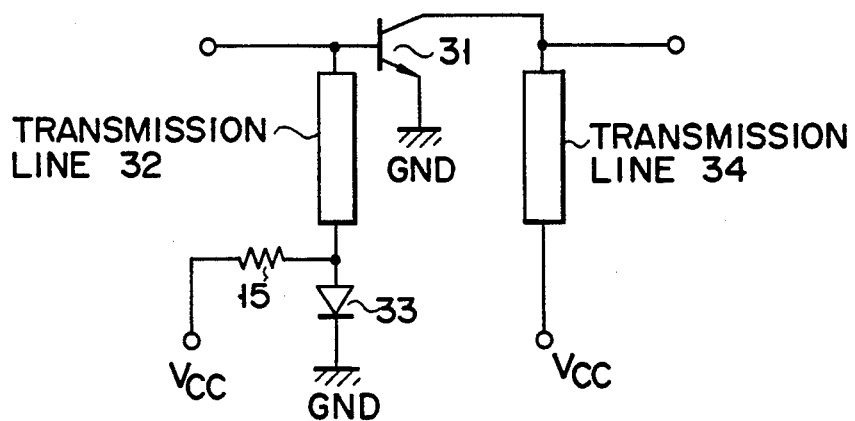
FIG. 2 schematically designates the second block diagram of a conventional power amplifying circuit solely available for the "class AB" amplification mode.
Figure 3:
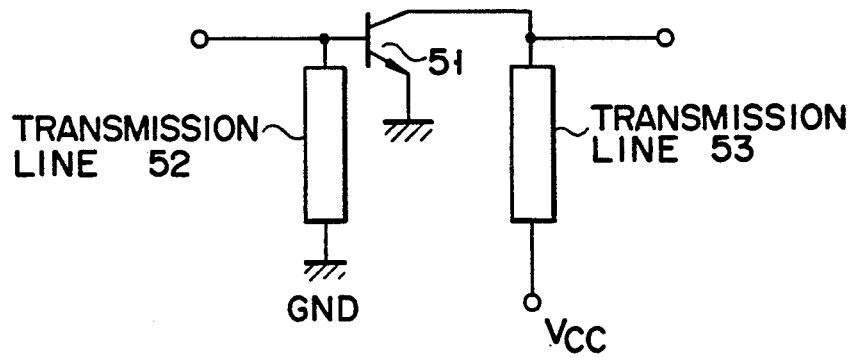
FIG. 3 schematically designates the other block diagram of a conventional power amplifying circuit solely available for the "class C" amplification mode.

By virtue of the structure shown in FIG. 10, the power amplifying circuit can optionally vary the amplifying operation performed by the NPN transistor 1 merely by switching the voltage delivered to the $V_{BB}$ node 11. As a result, unlike the one shown in FIG. 9, the power amplifying circuit shown in FIG. 1 dispenses with a specific signal otherwise needed for selecting the amplifying mode and also dispenses with the control node 8. In consequence, there is no need of externally providing a switching control circuit for selecting the amplifying mode When the "class AB" amplifying mode is entered, the resistor 21 functions itself in those power amplifying circuits shown in FIGS. 8, 9, and 10. On the other hand, when the "class C" mode is entered, the resistor 21 is not operated in the power amplifying circuit. As a result, depending on the biased condition, resistance value is variable in the power amplifying circuit, and thus, irrespective of the biasing system applied to the "class AB" or "class C" amplifying mode, those power amplifying circuits shown in FIGS. 8 through 10 can stably and effectively operate themselves.

It should be noted that the power amplifying circuit should necessarily introduce those bias-switching N-channel MOS FETs 6 and 7 each containing minimum onstate resistance value. Depending on the dimensions and the current amplifying factor, scores of milliamperes through a maximum of several hundred milliamperes of bias current may flow through the power-amplifying NPN transistor 1. In this case, even if there were 10 Ω of the on-state resistance value in the MOS FETs 6 and 7, presence of this resistance value may cause the voltage to lower itself by more than 1 V. Taking this into account, it is essential for the power amplifying circuit embodied by the invention to provide a maximum of one-ohm of the on-state resistance value for those N-channel MOS FETs 6 and 7 which respectively switch the bias of the NPN transistor 1, and yet, it is further essential for the power amplifying circuit embodied by the invention to securely restrain the decline of voltage of be about 0.1 V.

Those power amplifying circuits presented by the above embodiments can respectively shift the "class AB" amplifying mode to the "class C" amplifying mode. Nevertheless, these power amplifying circuits embodied by the invention can also easily convert either of these modes into "class A" amplifying mode merely by increasing the number of N-channel MOS FET.

As is clear from the above description, according to the invention, power amplifying mode suited for the digital and analogue communication modes can selectively be switched from each other merely by applying a singleunit power amplifying circuit. The invention provides a useful power amplifying circuit compatible with both the digital and analogue communication systems built in compact size with reduced production cost.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power amplifying circuit comprising:
   a power amplifying transistor;
   a base-side transmission line which is provided on the side a of base of said power amplifying transistor;
   a resistance element which is directly connected to said base-side transmission line;
   a first switching element forming a current path connected in series to said resistance element for applying a first potential to said resistance element;
   a second switching element which is inserted between said base-side transmission line and a second potential; and
   a circuit means for varying the value of a base potential of said power amplifying transistor by means of opposite switching operations performed by the first and second switching elements.

2. A power amplifying circuit according to claim 1, wherein said first and second switching elements are respectively composed of a first-transfer transistor having a gate and a second transfer transistor having a gate.

3. A power amplifying circuit according to claim 2, wherein said first and second switching elements respectively have a maximum of one-ohm (1 Ω) of resistance value in the forward direction.

4. A power amplifying circuit comprising:
   a power amplifying transistor;

a base-side transmission line which is provided on the side of a base of said power amplifying transistor;

a resistance element which is directly connected to said base-side transmission line;

a first switching element forming a current path connected in series to said resistance element for applying a first potential to said resistance element;

a second switching element which is inserted between said base-side transmission line and a second potential;

a diode which compensates for temperature, wherein the anode of said diode is connected to said base-side transmission line, and wherein the cathode of said diode is connected to said second potential; and a circuit means for varying the value of a base potential of said power amplifying transistor by means of opposite switching operations performed by the first and second switching elements.

5. A power amplifying circuit according to claim 4, wherein said first and second switching elements are respectively composed of a first-transfer transistor having a gate and a second transfer transistor having a gate.

6. A power amplifying circuit according to claim 5, wherein said first and second switching elements respectively have a maximum of one-ohm (1 Ω) of resistance value in the forward direction.

7. A power amplifying circuit comprising:

a power amplifying transistor;

a base-side transmission line which is provided on the side of the base of said power amplifying transistor;

a first resistance element having an end connected to said base-side transmission line;

a second resistance element having an end connected to a first potential;

a first switching element which accommodates current path formed in series against said first and second resistance elements;

a second switching element which is inserted between said base-side transmission line and a second potential;

a temperature-compensating diode having anode connected to said base-side transmission line via said first resistance element, and wherein cathode of said diode is connected to said second potential; and a circuit means for varying the value of a base potential of said power amplifying transistor by means of opposite switching operations performed by the first and second switching elements.

8. A power amplifying circuit according to claim 7, wherein said first and second switching elements are respectively composed of a first-transfer transistor having a gate and a second transfer transistor having a gate.

9. A power amplifying circuit according to claim 8, wherein said first and second switching elements respectively have a maximum of one-ohm (1 Ω) of resistance value in the forward direction.

10. A power amplifying circuit according to claim 8, wherein said circuit means comprises:

a control node form which a control signal is supplied;

an inverter for inverting said control signal from said control node;

said control signal inverted by said inverter being supplied to the gate of said first transfer transistor; and said control signal being supplied to the gate of said second transfer transistor without being inverted by said inverter.

11. A power amplifying circuit according to claim 10, further comprising:

an operational amplifier which compares a bias voltage in the base of said power amplifying transistor with a reference voltage, and generates an output signal which constitutes said control signal.

12. A power amplifying circuit comprising:

a power amplifying transistor;

a base-side transmission line which is provided on the side of a base of said power amplifying transistor;

a resistance element which is connected to said base-side transmission line;

a first transfer transistor, having a gate, forming a current path connected in series to said resistance element for applying a first potential to said resistance element;

a second transfer transistor, having a gate, which is inserted between said base-side transmission line and a second potential;

a diode which compensates for temperature, wherein the anode of said diode is connected to said base-side transmission line, and wherein the cathode of said diode is connected to said second potential;

a control node from which a control signal for varying the value of a base potential of said power amplifying transistor is supplied;

an inverter for inverting said control signal from said control node;

said control signal inverted by said inverter being supplied to the gate of said second transfer transistor;

said control signal being supplied to the gate of said first transistor without being inverted by said inverter; and an integrator which receives a voltage for biasing the base of said power amplifying transistor and then executes an integration of said voltage and generates an output signal which constitutes said control signal.

13. A power amplifying circuit comprising:

a power amplifying transistor;

a base-side transmission line which is provided on the side of a base of said power amplifying transistor;

a resistance element which is connected to said base-side transmission line;

a first transfer transistor, having a gate, forming a current path connected in series to said resistance element for applying a first potential to said resistance element;

a second transfer transistor, having a gate, which is inserted between said base-side transmission line and a second potential;

a diode which compensates for temperature, wherein the anode of said diode is connected to said base-side transmission line, and wherein the cathode of said diode is connected to said second potential;

a control node from which a control signal for varying the value of a base potential of said power amplifying transistor is supplied;

an inverter for inverting said control signal from said control node;

said control signal inverted by said inverter being supplied to the gate of said second transfer transistor;

said control signal being supplied to the gate of said first transistor without being inverted by said inverter; and an operational amplifier which compares a bias voltage at the base of said power amplifying transistor with a reference voltage, and generates an output signal which constitutes said control signal.

* * * * *